(12) United States Patent
Stan et al.

(10) Patent No.: US 10,097,146 B2
(45) Date of Patent: Oct. 9, 2018

(54) RIPPLE REDUCTION METHOD FOR CHOPPER AMPLIFIERS

(71) Applicant: SEMICONDUCTOR COMPONENTS INDUSTRIES, LLC, Phoenix, AZ (US)

(72) Inventors: Matei Nicolae Stan, Falticeni (RO); Pavel-Viorel Brinzoi, Bucharest (RO)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/430,139

(22) Filed: Feb. 10, 2017

(65) Prior Publication Data

US 2018/0091103 A1 Mar. 29, 2018

Related U.S. Application Data

(60) Provisional application No. 62/401,391, filed on Sep. 29, 2016.

(51) Int. Cl.
*H03F 3/387* (2006.01)
*H03F 3/45* (2006.01)

(52) U.S. Cl.
CPC ......... *H03F 3/387* (2013.01); *H03F 3/45475* (2013.01); *H03F 3/45968* (2013.01); *H03F 2200/271* (2013.01); *H03F 2200/459* (2013.01); *H03F 2203/45212* (2013.01)

(58) Field of Classification Search
CPC .................................................. H03F 3/45892
USPC ...................................... 330/9; 327/124, 307
See application file for complete search history.

(56) References Cited

U.S. PATENT DOCUMENTS

| | | | |
|---|---|---|---|
| 7,132,883 B2 | 11/2006 | Huijsing et al. | |
| 7,292,095 B2 | 11/2007 | Burt et al. | |
| 7,345,529 B2 | 3/2008 | Atrash et al. | |
| 7,535,295 B1 | 5/2009 | Huijsing et al. | |
| 8,120,422 B1 * | 2/2012 | Huijsing | H03F 1/083 327/124 |

(Continued)

OTHER PUBLICATIONS

Johan F. Witte et al., "A CMOS Chopper Offset-Stabilized Opamp," IEEE Journal of Solid-State Circuits, vol. 42, No. 7, Jul. 2007, pp. 1529-1535.

*Primary Examiner* — Henry Choe
(74) *Attorney, Agent, or Firm* — Robert F. Hightower

(57) ABSTRACT

An electrical circuit comprising a modulating chopper configured to receive a differential input signal at a first frequency and modulate the differential input signal to a second frequency to form a modulated differential signal, a null amplifier coupled to the modulating chopper and configured to amplify the modulated differential signal to form an amplifier output, wherein amplifying the modulated differential signal causes a ripple in the amplifier output, a demodulating chopper coupled to the null amplifier and configured to demodulate the amplifier output to form a demodulated differential signal having a first portion at the first frequency and a second portion at a third frequency, an integrator coupled to the demodulating chopper and configured to integrate the demodulated differential signal to form an integrated differential signal, and an attenuator coupled to the integrator and configured to attenuate the integrated differential signal to compensate for at least part of the ripple.

16 Claims, 2 Drawing Sheets

FIG. 1

(56) References Cited

U.S. PATENT DOCUMENTS

| | | | |
|---|---|---|---|
| 8,179,195 B1 * | 5/2012 | Huijsing | H03F 3/38 330/124 R |
| 8,265,769 B2 | 9/2012 | Denison | |
| 9,294,049 B2 * | 3/2016 | Huijsing | H03F 1/56 |
| 2014/0232456 A1 | 8/2014 | Huijsing et al. | |

* cited by examiner

RIPPLE REDUCTION METHOD FOR CHOPPER AMPLIFIERS

CROSS-REFERENCE TO RELATED APPLICATIONS

The present application claims priority to U.S. Provisional Patent Application No. 62/401,391 filed Sep. 29, 2016 by Matei Nicolae Stan and Pavel-Viorel Brinzoi and entitled "Integrator-Based Circuit Compensation," which is incorporated herein by reference as if reproduced in its entirety.

BACKGROUND

Some electrical devices contain amplifiers or other components that interact with electrical signals within the electrical devices. Such components may be sensitive to variances (e.g., magnitude and/or frequency variations) within the electrical signals. Such variances may also affect electrical device outputs and these output variances are typically undesirable. However, compensating for these variances without introducing other potentially undesirable qualities to the signals may be difficult.

SUMMARY

At least some of the embodiments disclosed herein are directed to a system comprising: a main amplifier configured to amplify a differential input signal to form an amplified differential signal output, the main amplifier having a first offset; and a ripple reduction loop coupled to the main amplifier and configured to compensate for the first offset of the main amplifier, the ripple reduction loop comprising: a modulating chopper configured to: receive the differential input signal; and manipulate the differential input signal based on a first control signal to generate a modulated differential signal; a null amplifier coupled to the modulating chopper and configured to process the modulated differential signal to generate an amplifier output, the null amplifier having a second offset; a demodulating chopper coupled to the null amplifier and configured to manipulate the amplifier output based on a second control signal to generate a demodulated differential signal; an integrator coupled to the demodulating chopper and configured to manipulate the demodulated differential signal to form an integrated differential signal configured to compensate for the second offset; and an attenuator coupled to the integrator and configured to: attenuate the integrated differential signal to reduce an amplitude of the integrated differential signal to form an attenuated differential signal; and transmit the attenuated differential signal to the main amplifier to compensate for the first offset. Such embodiments may be supplemented in a variety of ways, including by adding any of the following concepts in any sequence and in any combination: further comprising a filter coupled between the demodulating chopper and the integrator and configured to filter the demodulated differential signal; wherein a common mode voltage of the differential input signal is greater than a supply voltage of the amplifier architecture; wherein the first control signal and the second control signal have a same frequency; wherein a plurality of resistors are coupled to the attenuator, wherein the attenuator attenuates the integrated differential signal according to an attenuation factor, and wherein the attenuation factor is based at least in part on the plurality of resistors; wherein transmitting the attenuated differential signal to the main amplifier to compensate for the first offset reduces the first offset in the amplified differential signal output to less than approximately +/−15 microvolts (μV); wherein transmitting the attenuated differential signal to the main amplifier to compensate for the first offset reduces the first offset in the amplified differential signal output to less than approximately +/−11 μV; and/or wherein the first chopper and the second chopper each comprise a transmission gate.

At least some of the embodiments disclosed herein are directed to a method, comprising: receiving a differential input signal; processing the differential input signal to produce a modulated differential signal; processing the modulated differential signal to produce an amplified differential signal configured to compensate for an amplifier offset, wherein processing the modulated differential signal causes a ripple in the amplified differential signal; integrating the modulated differential signal to produce an integrated differential signal configured to compensate for at least part of the ripple; and attenuating the integrated differential signal to reduce a peak-to-peak voltage of the ripple. Such embodiments may be supplemented in a variety of ways, including by adding any of the following concepts in any sequence and in any combination: wherein compensating for the offset of the amplifier reduces the amplifier offset to less than approximately +/−11 μV of zero offset; further comprising transmitting the attenuated differential signal to the amplifier to compensate for at least part of the amplifier offset; further comprising processing the amplified differential signal to produce a demodulated differential signal; wherein a portion of the demodulated differential signal resulting from the differential input signal has a first frequency, and wherein a portion of the demodulated differential signal resulting from the ripple has a second frequency; and/or further comprising filtering the compensated signal through a filter to compensate for at least part of the ripple at the second frequency.

At least some of the embodiments disclosed herein are directed to an electrical circuit, comprising: a modulating chopper configured to: receive a differential input signal at a first frequency; and modulate the differential input signal to a second frequency to form a modulated differential signal; a null amplifier coupled to the modulating chopper and configured to amplify the modulated differential signal to form an amplifier output, wherein amplifying the modulated differential signal causes a ripple in the amplifier output; a demodulating chopper coupled to the null amplifier and configured to demodulate the amplifier output to form a demodulated differential signal having a first portion at the first frequency and a second portion at a third frequency; an integrator coupled to the demodulating chopper and configured to integrate the demodulated differential signal to form an integrated differential signal; and an attenuator coupled to the integrator and configured to attenuate the integrated differential signal to compensate for at least a portion of the ripple. Such embodiments may be supplemented in a variety of ways, including by adding any of the following concepts in any sequence and in any combination: further comprising a filter coupled between the demodulating chopper and the integrator and configured to filter the demodulated differential signal; wherein the first portion has a relationship to the differential input signal, and wherein the second portion has a relationship to the ripple; wherein a plurality of capacitors are coupled to the integrator, and wherein an amplitude of the integrated differential signal is determined at least in part according to the plurality of capacitors; wherein a plurality of resistors are coupled to the attenuator, and wherein an amount of attenuation of the attenuator is determined at least in part according to the plurality of resistors; and/or wherein the electrical circuit is coupled to an amplifier via a secondary amplifier path and configured to transmit the attenuated differential signal to the amplifier via the secondary amplifier path to compensate for an offset on a first amplifier path of the amplifier.

BRIEF DESCRIPTION OF THE DRAWINGS

There are disclosed in the drawings and in the following description various embodiments for a ripple reduction method for chopper amplifiers. In the drawings.

Figure 1:
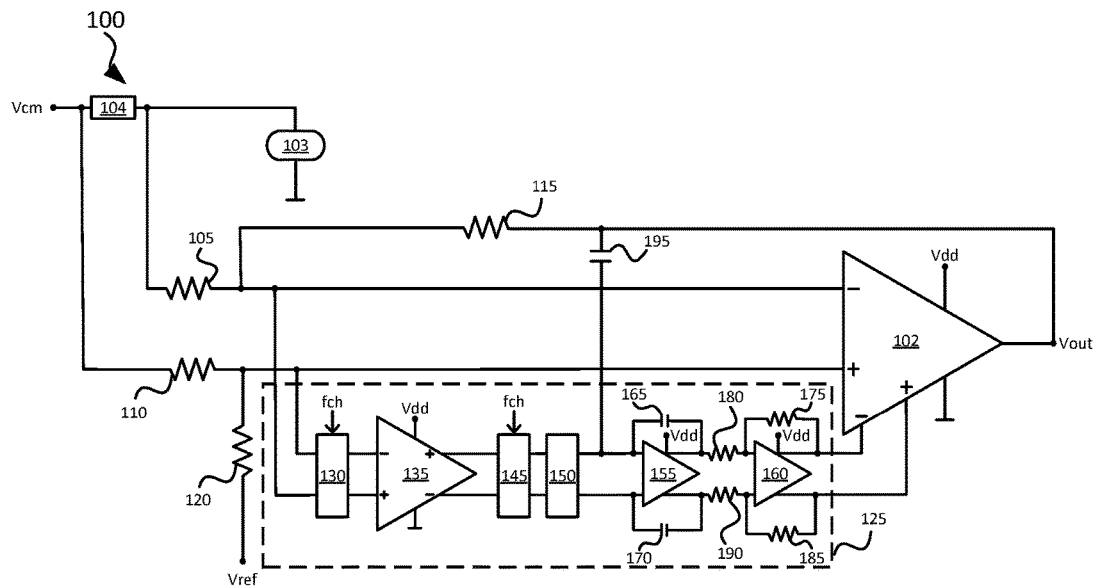
FIG. 1 is a schematic diagram of an electrical circuit in accordance with various embodiments.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

Certain electrical devices or components, for example, amplifiers (such as a chopper amplifier), charge pumps, direct current to direct current (DC/DC) converters, and/or other offset compensated circuits may have a ripple and/or other variation in a voltage magnitude of signals of the electrical devices. To compensate for the variations, the electrical devices may include ripple reduction circuitry, frequency compensation circuitry, offset compensation circuitry, or any combination of the above.

Disclosed herein are embodiments for reducing variation in an electrical signal of an electrical device. For example, at least some of the embodiments disclosed herein may reduce a ripple magnitude in an electrical signal of the electrical device and/or compensate for frequency drift in the electrical device. The disclosed embodiments may include a secondary path or ripple reduction loop coupled to an amplifier (e.g., coupled to a second differential input of the amplifier). The ripple reduction loop may include one or more electrical components configured to compensate for an offset (e.g., an input offset) of the amplifier (e.g., as present in, or resulting from, a primary path located at a first differential input of the amplifier). For example, in some embodiments the one or more electrical components may include any one or more of a modulator, a demodulator, a filter, an integrator, and/or an attenuator. The one or more electrical components may be configured to reduce an offset of the amplifier to approximately 10 µV. In some embodiments, compensating for the offset of the amplifier may contribute (e.g., cause at least in part) a ripple to a voltage magnitude of an electrical signal processed by the amplifier. As such, the one or more electrical components of the ripple reduction loop may also be configured to compensate for the ripple.

FIG. 1 is a schematic diagram of an electrical circuit 100 in accordance with various embodiments. The electrical circuit 100 may be configured to measure an amount of current (e.g., resulting from a common-mode input voltage ($V_{cm}$) of the electrical circuit 100) through the load 103 by measuring a differential voltage as present across a sense resistor 104. In some embodiments, the common-mode input voltage may exceed a supply rail (e.g., a supply voltage (Vdd)) of the electrical circuit 100. For example, the electrical circuit 100 may measure the differential voltage across the sense resistor 104 by processing the differential voltage (e.g., amplifying and/or otherwise manipulating the differential voltage) using one or more electrical components. As such, the electrical circuit 100 may, in some embodiments, comprise an amplifier architecture, such as a chopper amplifier, configured to amplify a differential input signal. In other embodiments, the electrical circuit 100 may be configured to amplify and/or manipulate a non-differential input signal. The electrical circuit 100 may be chopper stabilized (e.g., a chopper stabilized amplifier) at least in part by the ripple reduction loop 125, discussed below. The differential input signal may be a direct current (DC) signal. In some embodiments, the differential input signal may have a comparatively small amplitude (e.g., as compared to a common-mode voltage of the electrical circuit 100, a supply voltage of any one or more components of the electrical circuit 100, and/or an output of the electrical circuit 100). In such embodiments, the electrical circuit 100 may be configured to provide a high gain to facilitate processing of the differential input signal of the low amplitude. In some embodiments, the electrical circuit 100 may be implemented using standard complementary metal oxide semiconductor (CMOS) technology, and as such may enable precision current sensing using the standard CMOS technology without a need for adaptive filtering. The differential input signal may include a positive signal component and a negative signal component, which in some embodiments may also be referred to as a non-inverted signal component and an inverted signal component, respectively.

The electrical circuit 100 may include an amplifier 102 that may be configured to amplify the differential input signal. The amplifier 102 may be an operational amplifier and may include a plurality of amplifier paths. For example, the amplifier 102 may include a first amplifier path coupled to the differential input signal and a second amplifier path coupled to the ripple reduction loop 125, discussed below. The amplifier 102 may be a differential amplifier in which an output of the amplifier 102 ($V_{out}$) is determined according to a relationship between a first input of the amplifier 102 received on the first amplifier path and a second input of the amplifier received on the second amplifier path. In various embodiments the relationship may be the first input minus the second input, the second input minus the first input, or the first input plus the second input. The resistors 105, 110, 115, and 120 may comprise a feedback network that is coupled to the amplifier 102. As such, a gain of the amplifier 102 may be determined based on the resistors 105, 110, 115, and 120. A resistance value of the resistor 105 is approximately equal to a resistance value of the resistor 115 and a resistance value of the resistor 110 is approximately equal to a resistance value of the resistor 120. For example, the gain of the amplifier may be determined, in some embodiments, based on a ratio of the resistor 115 to the resistor 105 and a ratio of the resistor 120 to the resistor 110 (where each ratio may be approximately equal). Generally, resistance values of the resistors 105, 110, 115, and 120 may be determined such that a gain of each input of the differential input of the amplifier 102 may be approximately equal. In some embodiments, the resistor 120 may be coupled to a reference voltage ($V_{ref}$) such as a voltage between 0 volts (V) and $V_{dd}$.

The amplifier 102 may, in some embodiments, have an offset (e.g., input offset existing between a first input of the differential input (e.g., the positive signal component) terminal and a second input of the differential input (e.g., the negative signal component)) terminal that may affect an output of the amplifier 102 if left uncompensated. For example, the offset may cause the output of the amplifier 102 to vary from a nominal or accurate value based on an expected relationship between the differential input signal and the feedback network of resistors 105, 110, 115, and 120. The offset may result, in some embodiments, from a construction and/or internal structure or components of the amplifier 102 and, as such, may be inherent to the amplifier 102. In some embodiments the offset of the amplifier 102 may be unchanging, while in other embodiments the offset of the amplifier 102 may change according to a usage case of the amplifier 102 (e.g., according to one or more electrical components coupled to the amplifier 102, a value of an input of the amplifier 102, a load coupled to the amplifier 102, and the like). Optionally, the electrical circuit 100 may include a capacitor 195 coupled between the output of the amplifier 102 and the ripple reduction loop 125, discussed below. The capacitor 195 may be a compensation capacitor that may compensate for fluctuations in the output of the amplifier 102. A value of the capacitor 195 may be determined, for example, according to a number of stages in the amplifier 102 (e.g., based at least in part on a number of poles and/or zeros in a signal path of the amplifier 102).

The electrical circuit 100 may also include a ripple reduction loop 125 that may include electrical components configured to compensate for the offset of the amplifier 102. The ripple reduction loop 125 may be an offset compensation circuit that may be configured to compensate for an offset of the amplifier 102 via a differential signal with a minimized ripple amplitude. The ripple reduction loop 125, in some embodiments, is coupled to the differential input signal and the amplifier 102 (e.g., to a second differential input of the amplifier 102). The ripple reduction loop 125 may include a first chopper 130 (e.g., a modulating chopper) that may be configured to manipulate the differential input signal that is a DC signal, which may be time invariant, to a DC signal that is time variant to form a modulated differential signal. Converting the differential input signal to the time variant modulated differential signal may allow the modulated differential signal to be processed in a manner substantially similar in nature to manners for processing an alternating current (AC) signal, as known to one of ordinary skill in the art. The first chopper 130 may be configured to, based on a control signal (e.g., the control signal $f_{ch}$) received at a frequency indicative of a desired output frequency of the first chopper 130, pass or block passage of the differential input signal through the first chopper 130 to form the modulated differential signal. In some embodiments, the frequency of the control signal may exceed a 1/f corner frequency, where f is the frequency of the control signal. The first chopper 130 may convert the differential input signal from a first frequency to the modulated differential signal at a second frequency that is higher than the first frequency, where the second frequency has a relationship to the frequency at which the first chopper 130 receives the control signal. For example, in some embodiments, when the first chopper 130 receives the control signal, the first chopper 130 may output the differential input signal as the modulated differential signal. When the first chopper 130 does not receive the control signal, the first chopper 130 may not output the differential input signal as the modulated differential signal. In this way, the first chopper 130 may create the modulated differential signal by converting the differential input signal to the modulated differential signal at a higher frequency than the differential input signal based on the control signal. In other embodiments, operation of the first chopper 130 may be reversed such that the first chopper 130 outputs the differential input signal as the modulated differential signal when the control signal is not received by the first chopper 130 and does not output the differential input signal as the modulated differential signal when the control signal is received by the first chopper 130. Accordingly, in some embodiments the first chopper 130 may be implemented using one or more controllable switches and/or one or more transmission gates, each of which may be configured to operate according to the control signal.

The ripple reduction loop 125 may also include a null amplifier 135 coupled to the first chopper 130. The null amplifier 135 may be further coupled to VDD and to a ground potential (GND). The null amplifier 135 may be configured to compensate for at least a portion of the offset of the amplifier 102. For example, the null amplifier 135 may be configured to amplify the modulated differential signal output by the first chopper 130 to form a null amplifier output that compensates for at least a portion of the offset of the amplifier 102. An amount of the offset of the amplifier 102 that may be compensated for by the null amplifier 135 may be determined according to a gain of the null amplifier 135. For example, a greater amount of gain of the null amplifier 135 may compensate for a greater amount of the offset of the amplifier 102 than a lesser amount of gain of the null amplifier 135. Differential input terminals of the null amplifier 135 may have an additional associated offset which may be inherent to the null amplifier 135, for example, substantially similar to the offset of the amplifier 102 discussed above and not repeated here. The offset of the null amplifier 135 may have a relationship to an amount of gain of the null amplifier 135. For example, for a null amplifier 135 having a higher amount of gain, the offset of the null amplifier 135 may be greater than a null amplifier 135 having a lesser amount of gain. The offset of the null amplifier 135 may exist at the second frequency formed by the first chopper 130 modulating the differential input signal to form the modulated differential signal. Additionally, the offset of the null amplifier 135 may cause a ripple in the amplifier output, where an amplitude of the ripple has a relationship to an amount of the offset of the null amplifier 135 and/or to a gain of the null amplifier 135. For example, the amplitude of the ripple in the amplifier output may increase as an amount of the offset of the null amplifier 135 and/or a gain of the null amplifier 135 increases. The offset of the null amplifier 135 and the resulting ripple in the amplifier output may be compensated for by other electrical components of the ripple reduction loop 125 (e.g., a filter, the integrator 155, and/or the attenuator 160, discussed below).

The ripple reduction loop 125 may also include a second chopper 145 (e.g., a demodulating chopper) that may be configured to, based on a received control signal (which may be received at a same frequency as the control signal received by the first chopper 130), demodulate the differential output of the null amplifier 135 to form a demodulated differential signal. Demodulating the differential output of the null amplifier 135 may convert the amplifier output to return the amplifier output from the second frequency back to the first frequency. For example, the second chopper 145 may counteract or "undo" the conversion performed by the first chopper 130 from the first frequency to the second frequency. When the second chopper 145 converts the amplifier output from the second frequency to the first frequency, a portion of the amplifier output comprising the compensation for the offset of the amplifier 102 (e.g., the portion of the amplifier output that originated as the differential input signal prior to processing by the first chopper 130 and amplification by the null amplifier 135) is returned to the first frequency while a portion of the amplifier output comprising the offset of the null amplifier 135 (e.g., the portion of the amplifier output that was introduced to the amplifier output as a function of the offset of the null amplifier 135 and does not bear a relationship to the differential input signal) remains at the second frequency.

For example, because the offset of the null amplifier 135 did not exist in the modulated reference signals formed by the first chopper 130, when the second chopper 145 demodulates the amplifier output, the offset of the null amplifier 135 may be modulated to a higher frequency while the remainder of the amplifier output is demodulated to the first frequency (e.g., which may be a baseband representation of the amplifier output). In this way, the portion of the amplifier output comprising the offset of the null amplifier 135 exists in the demodulated differential signal at a frequency separate than the frequency of the portion of the amplifier output comprising the compensation for the offset of the amplifier 102. As such, the portion of the amplifier output comprising the offset of the null amplifier 135 is capable of being filtered and/or processed from the demodulated differential signal by at least some components of the ripple reduction loop 125 while having a minimum effect on the portion of the demodulated differential signal containing the amplifier output comprising the compensation for the offset of the amplifier 102. In some embodiments, the demodulated differential signal may include a ripple resulting from the offset of the null amplifier 135, as discussed above.

Optionally, in some embodiments, the ripple reduction loop 125 may also include a filter 150. The filter 150 may be coupled to the second chopper 145 and, in some embodiments, configured to filter the demodulated differential signal to effectively remove a particular frequency range (e.g., by attenuating the frequency range to a low level) from the demodulated differential signal. For example, the filter 150 may be a notch filter, a band-stop filter, a band-pass filter, a low-pass filter, a high-pass filter, and/or any other suitable filter that may filter and/or remove a frequency range from the demodulated differential signal while having a minimum effect on a remainder of the demodulated differential signal existing outside of the frequency range. The filter 150 may filter the demodulated differential signal comprising the offset of the null amplifier 135 to compensate for at least some of the portion of the offset of the null amplifier 135 (e.g., the ripple) by attenuating at least a portion of the demodulated differential signal that comprises at least some portion of the offset of the null amplifier 135.

The ripple reduction loop may also include an integrator 155, which may be cascaded with (e.g., coupled to and electrically followed in the ripple reduction loop 125) an attenuator 160. The integrator 155 and the attenuator 160 may be configured to compensate for at least a portion of the offset of the null amplifier 135 and/or compensate for at least a portion of the offset of the amplifier 102. For example, the integrator 155 and the attenuator 160 may be configured to reduce an amplitude of the ripple resulting from the offset of the null amplifier 135 and/or reduce a magnitude of the offset of the amplifier 102. The demodulated differential signal (or the filtered demodulated differential signal when the ripple reduction loop 125 includes the filter 150) may be processed by the integrator 155 to convert the demodulated differential signal that includes the ripple resulting from the offset of the null amplifier 135 into two triangular waveforms. Each of the two triangular waveforms may correspond to one component (e.g., the positive or the negative component) of the demodulated differential signal. Additionally, the two triangular waveforms may have opposite phases. Amplitudes of the triangular waveforms may, in some embodiments, be inversely proportional to capacitance values of capacitors 165 and 170.

The attenuator 160 may be coupled to the integrator 155 and configured to attenuate the triangular waveforms according to an attenuation factor to form an attenuated differential signal. The attenuator 160 may be implemented as an active electrical component (e.g., an amplifier having a gain of less than 1, which may be referred to as the attenuation factor) and may interact with one or more other active and/or passive electrical components to attenuate the triangular waveforms. However, in other embodiments the attenuator 160 may be implemented using one or more passive electrical components (e.g., a voltage divider network using fixed and/or programmable/controllable resistance values). The attenuation factor may be determined by the resistors 175, 180, 185, and 190 to reduce an amplitude of the ripple of the triangular waveforms. For example, the attenuation factor may be determined according to a ratio of the resistor 175 to the resistor 180 and the resistor 185 to the resistor 190. In one embodiment, the resistors 180 and 190 may have a resistance value of R and the resistors 175 and 185 may have a resistance value of approximately 20R. In such an embodiment, the attenuator 160 has an attenuation factor of approximately 20 and reduces the amplitude of the triangular waveform by a factor of 20 (e.g., a gain of 1/20). Optionally, the ripple reduction loop 125 may include an auxiliary amplifier (not shown) positioned between the attenuator 160 and the amplifier 102 to process and/or manipulate the attenuated differential signal prior to receipt of the attenuated differential signal by the amplifier 102.

The attenuator 160 may provide the attenuated differential signal to the amplifier 102 (e.g., via the second amplifier path, discussed above) to compensate for the offset of the amplifier 102. The attenuator 160 may provide the attenuated differential signal to the amplifier 102 in an inverted manner to compensate, at least in part, for the offset of the amplifier 102. For example, a portion of the attenuated differential signal resulting from a negative component of the differential input signal may be provided to the amplifier 102 as a positive component of the attenuated differential signal, and a portion of the attenuated differential signal resulting from a positive component of the differential input signal may be provided to the amplifier 102 as a negative component of the attenuated differential signal. The amplifier 102 may manipulate one or both of the differential input signal (e.g., received via the first amplifier path) and/or the attenuated differential signal (e.g., received via the second amplifier path) to compensate, at least in part, for the offset of the amplifier 102 and to generate the output of the amplifier 102, as discussed above. For example, the output of the amplifier 102 may be determined, at least in part, by the differential input signal plus the attenuated differential signal, the differential input signal minus the attenuated differential signal, and/or any other suitable relationship in which the attenuated differential signal compensates, at least in part, in the output of the amplifier 102 for the offset of the amplifier 102. The ripple reduction loop 125 may compensate for the offset of the amplifier 102 such that the offset of the amplifier 102 may be less than, or equal to, about +/−20 μV, about +/−15 μV, about +/−11 μV, or about +/−10 μV of approximately zero offset.

Figure 2:
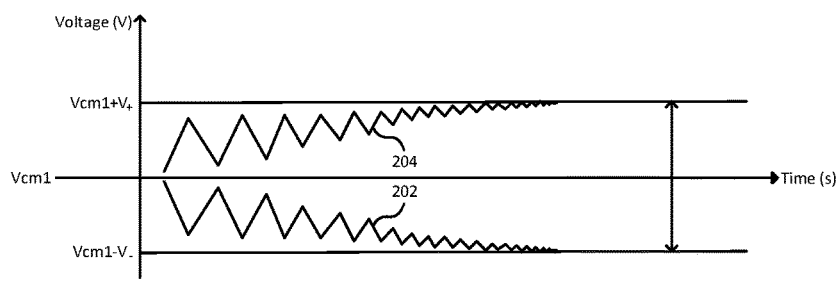
FIG. 2 is a graph illustrating outputs of the integrator and attenuator of a ripple reduction loop in accordance with various embodiments.
Figure 2:
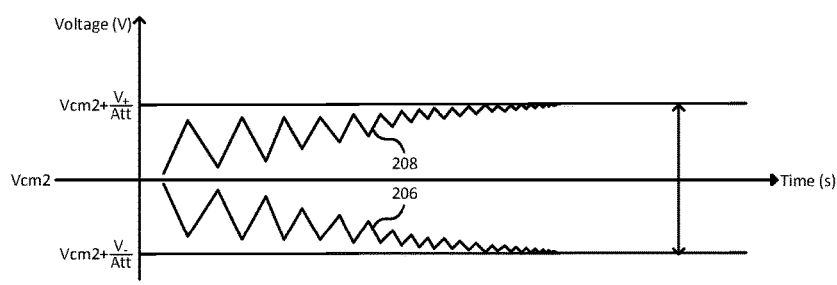

FIG. 2 includes a graph that illustrates the triangular waveforms of the integrator 155 and the attenuated differential signal of the attenuator 160 of the ripple reduction loop 125 in accordance with various embodiments. As discussed above, the integrator 155 may form the triangular waveforms according to a received differential signal. For example, the triangular waveform 204 may result from the integrator 155 integrating a positive component of the received differential signal and the triangular waveform 202 may result from the integrator 155 integrating a negative component of the received differential signal. Amplitudes of the triangular waveforms 204 ($V_+$) and 202 ($V_-$) may depend, at least in part, on an amplitude of the received differential signal and/or a configuration of the integrator 155 (e.g., as a result of one or more components, such as capacitors, coupled to the integrator 155). The triangular waveforms 202 and 204 may be anti-phase waveforms and may have approximately equal amplitudes with respect to a common mode voltage that is shared between the triangular waveforms 202 and 204.

The attenuator 160 may form the attenuated differential signals 206 and 208 according to the triangular waveforms received from the integrator 155 by attenuating the triangular waveforms 202 and 204 to reduce a peak-to-peak voltage of the triangular waveforms 202 and 204. For example, at a steady state condition, a peak-to-peak voltage of each of the triangular waveforms 202 and 204 may be in a range of millivolts (mV). As illustrated by FIG. 2, the attenuator 160 may attenuate the triangular waveforms 202 and 204 such that a peak-to-peak voltage of each of the attenuated differential signals 206 and 208 may be in a range of µV. For example, as illustrated by FIG. 2 and discussed above, the peak-to-peak voltage of the attenuated differential signals 206 and 208 may be determined according to the peak-to-peak voltage of the triangular waveforms 202 and 204 and the attenuation factor (Att) of the attenuator 160. For example, the peak-to-peak voltage of the attenuated differential signals 206 and 208 may be determined by dividing the peak-to-peak voltage of the triangular waveforms 202 and 204 by the attenuation factor of the attenuator 160. The attenuated differential signals 206 and 208 may comprise a compensation voltage ($V_{comp}$) that is provided to the amplifier 102 to compensate, at least in part, for the offset of the amplifier 102, discussed above. For example, $V_{comp}$ may be defined as the difference between the attenuated differential signals 206 and 208 at any given time.

Figure 3:
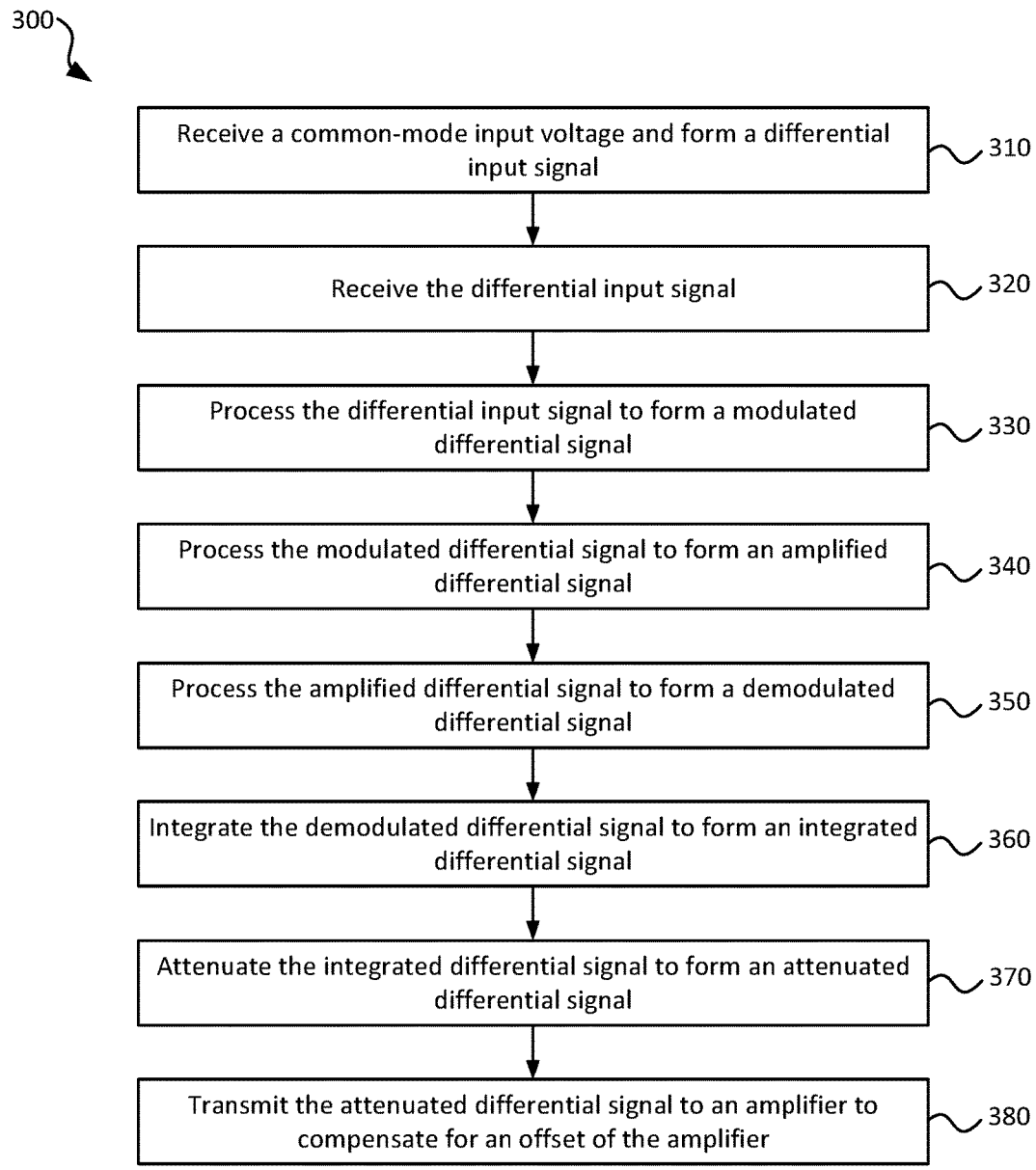
FIG. 3 is a flowchart of a method of amplifier offset compensation in accordance with various embodiments.

FIG. 3 is a flowchart of a method 300 for amplifier offset compensation in accordance with various embodiments. The method 300 may be implemented by the various components of the electrical circuit 100, as discussed above, or by any other circuits or components that may differ in name or design but provide a similar functionality to that of the electrical circuit 100. The method 300 may be implemented, for example, when a signal is received for amplification by an amplifier (e.g., the amplifier 102) of the electrical circuit 100.

At step 310, the electrical circuit 100 receives a common mode voltage input and forms, via a sense resistor, a differential input signal. For example, a positive component of the differential input signal may be determined based on a voltage present at a first side of the sense resistor and a negative component of the differential input signal may be determined based on a voltage present at a second side of the sense resistor. At step 320, the differential input signal may be received by the amplifier 102 and the ripple reduction loop 125. At step 330, the differential input signal may be processed (e.g., by the first chopper 130) to generate a modulated or time variant differential signal. The modulated differential signal may be capable of being processed according to AC methodologies as may be known to one of ordinary skill in the art. The differential input signal may be processed by the first chopper 130, or by other suitable modulating electrical components (e.g., one or more transmission gates), operating under control of a chopper or modulating frequency control signal.

At step 340, the modulated signal is processed (e.g., by the null amplifier 135) to form an amplified differential signal (e.g., the amplifier output of the null amplifier 135) to enable compensation of an offset of the amplifier 102. In some embodiments, processing the modulated signal to form the amplified differential signal may introduce a ripple into the amplified signal (e.g., the ripple may result from an offset of an amplifier, such as the null amplifier 135, that performs the processing). Left uncompensated for, the ripple in the amplified differential signal may cause a ripple in the output of the amplifier 102 in the electrical circuit 100.

At step 350, the amplified differential signal may be processed (e.g., by the second chopper 145) to form a demodulated or time invariant differential signal. The amplified signal may be processed by the first chopper 130, or by other suitable modulating electrical components (e.g., one or more transmission gates), operating under control of the chopper or modulating frequency control signal of step 330. Generating the demodulated differential signal may return a portion of the amplified differential signal resulting from the modulated differential signal to approximately the same frequency as the differential input signal while changing a portion of the amplified differential signal resulting from the offset of the null amplifier 135 to an increased frequency. Optionally, step 350 may further include filtering the demodulated differential signal to attenuate at least a portion of a frequency range of the demodulated differential signal. For example, the demodulated differential signal may be filtered to attenuate at least a part of the demodulated differential signal resulting from the offset of the null amplifier 135 (e.g., the ripple).

At step 360, the demodulated differential signal may be integrated (e.g., by the integrator 155) to produce an integrated differential signal, where each component of the integrated differential signal comprises a triangular waveform. Each of the triangular waveforms may be anti-phase waveforms whose amplitude may have a relationship (e.g., an inversely proportional relationship) to values of one or more components (e.g., the capacitors 165 and 170) coupled to the integrator 155. At step 370, the integrated differential signal may be attenuated (e.g., by the attenuator 160) to reduce an amplitude of the triangular waveforms and form an attenuated differential signal. Forming the attenuated differential signal may reduce the ripple resulting from the offset of the null amplifier 135 based on an attenuation factor of the attenuator 160. In some embodiments, the attenuator 160 may move a zero introduced into the signal path of the integrated differential signal by the integrator 155 to provide efficient frequency compensation in the attenuated differential signal. At step 380, the resulting attenuated differential signal may be transmitted by the attenuator 160 to the amplifier 102 to provide offset compensation that compensates for the offset of the amplifier 102 to reduce the offset to within a predetermined range of zero offset. The predetermined range may be approximately +/−20 µV, +/−15 µV, +/−11 µV, or +/−10 µV of approximately zero offset.

While certain resistors and capacitors have been described herein as single components, each may generally be representative of an amount of resistance (in the case of resistors) or capacitance (in the case of capacitors). Any one or more of the resistors and/or capacitors may in practice comprise any one or more combinations of individual elements, for example, resistive elements such as resistors, programmable/controllable resistors, and/or any other elements that comprise a measurable amount of resistance in the case of resistors or capacitive elements such as capacitors, programmable/controllable capacitors, and/or any other elements that comprise a measurable amount of capacitance. Any combination of the one or more resistors and/or capacitors may be coupled in series and/or in parallel to form the amount of resistance or capacitance represented by a respective resistor or capacitor.

Numerous other variations and modifications will become apparent to those skilled in the art once the above disclosure and the attached appendix are fully appreciated. It is intended that the following claims be interpreted to embrace all such variations, modifications and equivalents. Unless otherwise stated, "approximately" and "about" mean+/−10 percent of the stated value or of a reference value. In addition, the term "or" should be interpreted in an inclusive sense.

What is claimed is:

1. A system, comprising:
 a main amplifier configured to amplify a differential input signal to form an amplified differential signal output, the main amplifier having a first offset; and
 a ripple reduction loop coupled to the main amplifier and configured to compensate for the first offset of the main amplifier, the ripple reduction loop comprising:
  a modulating chopper configured to:
   receive the differential input signal; and
   manipulate the differential input signal based on a first control signal to generate a modulated differential signal;
  a null amplifier coupled to the modulating chopper and configured to process the modulated differential signal to generate an amplifier output, the null amplifier having a second offset;
  a demodulating chopper coupled to the null amplifier and configured to manipulate the amplifier output based on a second control signal to generate a demodulated differential signal;
  an integrator coupled to the demodulating chopper and configured to manipulate the demodulated differential signal to form an integrated differential signal configured to compensate for the second offset; and
  an attenuator coupled to the integrator and configured to:
   attenuate the integrated differential signal to reduce an amplitude of the integrated differential signal to form an attenuated differential signal; and
   transmit the attenuated differential signal to the main amplifier to compensate for the first offset.

2. The system of claim 1, further comprising a filter coupled between the demodulating chopper and the integrator and configured to filter the demodulated differential signal.

3. The system of claim 1, wherein a common mode voltage of the differential input signal is greater than a supply voltage of the system.

4. The system of claim 1, wherein the first control signal and the second control signal have a same frequency.

5. The system of claim 1, wherein a plurality of resistors are coupled to the attenuator, wherein the attenuator attenuates the integrated differential signal according to an attenuation factor, and wherein the attenuation factor is based at least in part on the plurality of resistors.

6. The system of claim 1, wherein transmitting the attenuated differential signal to the main amplifier to compensate for the first offset reduces the first offset in the amplified differential signal output to less than approximately +/−15 microvolts (μV).

7. The system of claim 6, wherein transmitting the attenuated differential signal to the main amplifier to compensate for the first offset reduces the first offset in the amplified differential signal output to less than approximately +/−11 μV.

8. The system of claim 1, wherein the modulating chopper and the demodulating chopper each comprise a transmission gate.

9. A method, comprising:
 receiving a differential input signal;
 processing the differential input signal to produce a modulated differential signal;
 processing the modulated differential signal to produce an amplified differential signal configured to compensate for an amplifier offset, wherein processing the modulated differential signal causes a ripple in the amplified differential signal;
 processing the amplified differential signal to produce a demodulated differential signal, wherein a portion of the demodulated differential signal resulting from the differential input signal has a first frequency, and wherein a portion of the demodulated differential signal resulting from the ripple has a second frequency;
 filtering the compensated signal through a filter to compensate for at least part of the ripple at the second frequency;
 integrating the filtered demodulated differential signal to produce an integrated differential signal configured to compensate for at least part of the ripple; and
 attenuating the integrated differential signal to reduce a peak-to-peak voltage of the ripple.

10. The method of claim 9, wherein compensating for the amplifier offset reduces the amplifier offset to less than approximately +/−11 microvolts (μV) of zero offset.

11. The method of claim 9, further comprising transmitting the attenuated differential signal to the amplifier to compensate for at least part of the amplifier offset.

12. An electrical circuit, comprising:
 a modulating chopper configured to:
  receive a differential input signal at a first frequency; and
  modulate the differential input signal to a second frequency to form a modulated differential signal;
 a null amplifier coupled to the modulating chopper and configured to amplify the modulated differential signal to form an amplifier output, wherein amplifying the modulated differential signal causes a ripple in the amplifier output;
 a demodulating chopper coupled to the null amplifier and configured to demodulate the amplifier output to form a demodulated differential signal having a first portion at the first frequency and a second portion at a third frequency;
 an integrator coupled to the demodulating chopper and configured to integrate the demodulated differential signal to form an integrated differential signal; and
 an attenuator coupled to the integrator and configured to attenuate the integrated differential signal to form an attenuated differential signal to compensate for at least a portion of the ripple,
 wherein the electrical circuit is coupled to an amplifier via a secondary amplifier path and configured to transmit the attenuated differential signal to the amplifier via the secondary amplifier path to compensate for an offset on a first amplifier path of the amplifier.

13. The electrical circuit of claim 12, further comprising a filter coupled between the demodulating chopper and the integrator and configured to filter the demodulated differential signal.

14. The electrical circuit of claim 12, wherein the first portion has a relationship to the differential input signal, and wherein the second portion has a relationship to the ripple.

15. The electrical circuit of claim 12, wherein a plurality of capacitors are coupled to the integrator, and wherein an amplitude of the integrated differential signal is determined at least in part according to the plurality of capacitors.

16. The electrical circuit of claim 12, wherein a plurality of resistors are coupled to the attenuator, and wherein an amount of attenuation of the attenuator is determined at least in part according to the plurality of resistors.

* * * * *